United States Patent [19]

Mossman

[11] 4,024,298
[45] May 17, 1977

[54] METHOD OF PROVIDING STORAGE DIELECTRIC OF PHOSPHOR PARTICLES COATED WITH SECONDARY EMISSIVE MATERIAL

[75] Inventor: Ralph Allen Mossman, Portland, Oreg.

[73] Assignee: Tektronix, Inc., Beaverton, Oreg.

[22] Filed: Apr. 19, 1976

[21] Appl. No.: 677,936

Related U.S. Application Data

[60] Division of Ser. No. 458,947, April 8, 1974, Pat. No. 3,982,150, which is a division of Ser. No. 37,378, May 7, 1970, Pat. No. 3,862,450, which is a continuation of Ser. No. 618,129, Feb. 23, 1967, abandoned.

[52] U.S. Cl. .................................. 427/64; 427/67; 427/157; 427/158; 427/215
[51] Int. Cl.² .................. H01J 29/39; H01J 29/10
[58] Field of Search .......... 313/68, 92 R, 107, 396, 313/398, 400; 252/2; 427/64, 67, 157, 158, 215

[56] References Cited

UNITED STATES PATENTS

| | | | |
|---|---|---|---|
| 2,169,046 | 8/1939 | Headrick | 313/400 |
| 3,264,133 | 8/1966 | Brooks | 427/64 X |
| 3,540,908 | 11/1970 | Carrill | 427/64 |
| 3,544,354 | 12/1970 | Kachel | 427/64 |
| 3,862,450 | 1/1975 | Mossman | 313/398 X |
| 3,982,150 | 9/1976 | Mossman | 427/64 X |

*Primary Examiner*—Michael R. Lusignan
*Attorney, Agent, or Firm*—John D. Winkelman

[57] ABSTRACT

An improved method for manufacturing a charge image storage dielectric capable of bistable storage is described. The storage dielectric is made by coating phosphor particles with a secondary emissive-forming substance, and then heating the coated particles to form secondary emissive material and simultaneously bond it to the surface of the phosphor particles.

8 Claims, 5 Drawing Figures

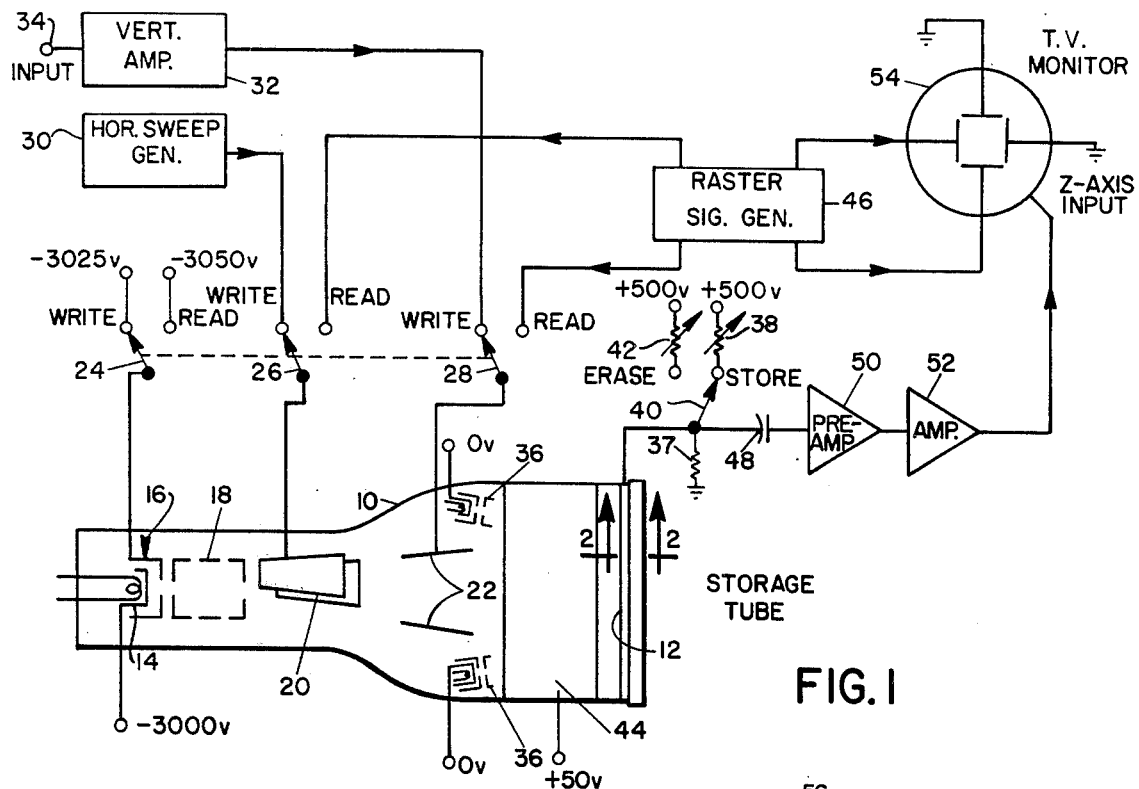
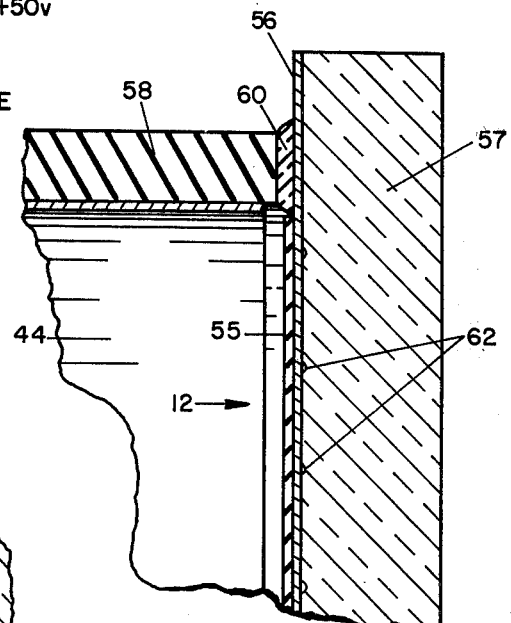
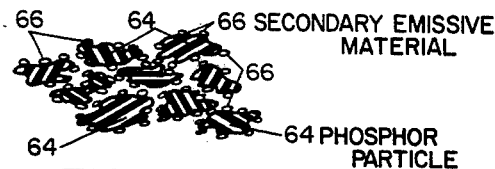
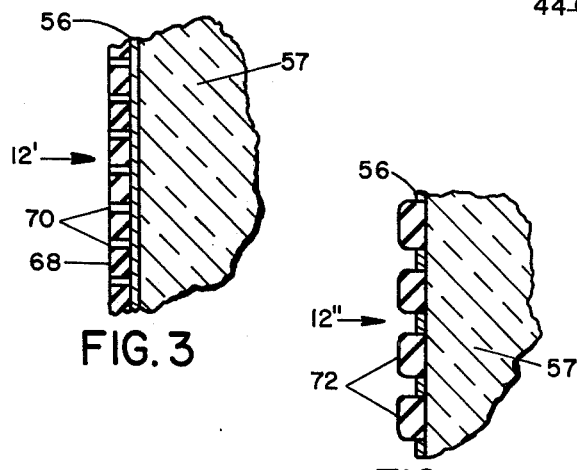

METHOD OF PROVIDING STORAGE DIELECTRIC OF PHOSPHOR PARTICLES COATED WITH SECONDARY EMISSIVE MATERIAL

CROSS REFERENCE TO RELATED APPLICATIONS

This is a division of U.S. application Ser. No. 458,947, filed Apr. 8, 1974 and issued Sept. 21, 1976 as U.S. Pat. No. 3,982,150, which was a division of application Ser. No. 37,378, filed May 7, 1970 and issued Jan. 21, 1975 as U.S. Pat. No. 3,862,450, which was a continuation of application Ser. No. 618,129, filed Feb. 23, 1967 and now abandoned.

BACKGROUND OF THE INVENTION

The present invention relates generally to charge image storage tubes having a direct viewing storage target including a storage dielectric layer of phosphor material capable of bistable storage of a charge image and which emits a light image corresponding to such charge image.

More particularly, the invention relates to an improved storage dielectric of phosphor particles coated with smaller particles of high secondary electron emissive material bonded only to the surface of such phosphor particles and distributed uniformly throughout a layer of the dielectric, and to a method of manufacture of such a storage dielectric. The method of manufacture comprises coating phosphor particles with a secondary emissive-forming substance, and then heating the coated phosphor particles to produce the secondary emissive material and, simultaneously, bond such secondary emissive material to the phosphor particles.

The improved storage dielectric produced by the method of the present invention is especially useful in direct viewing bistable storage tubes of the type employed in certain storage type cathode-ray oscilloscopes, but may also be used in radar and sonar apparatus, as well as in other display devices such as those employed as part of data transmission systems.

Previous bistable storage tubes employing phosphor storage dielectrics have had a slow "writing speed" (the maximum deflection velocity at which a stored charge can be produced by a writing beam, due to the relatively low secondary electron emission of the phosphor material. In order to increase writing speed it has been proposed to add higher secondary electron emissive material, such as magnesium oxide, to the phosphor storage dielectric by loosely mixing particles of magnesium oxide with particles of phosphor material. While this does increase writing speed, unfortunately it has the disadvantage of greatly reducing the brightness of the light image emitted by the phosphor material due to the large amount of magnesium oxide required. As a result, prior art bistable storage tubes employing phosphor storage dielectrics either have high brightness, about 6 foot-lamberts, but relatively slow writing speed, approximately 25,000 centimeters per second, if the secondary emissive additive is omitted, or have a relatively low brightness, about 2 foot-lamberts, and a high writing speed, 100,000 centimeters per second, if such secondary emissive additive is used. Thus previously it was thought that both high brightness and fast writing speed were not possible when using a storage dielectric of phosphor material.

The method of the present invention solves the above-mentioned problem by providing the high secondary emissive material as a coating of smaller particles on the surface of the phosphor particles. In this way, the secondary additive material is used most efficiently, greatly reducing the amount needed to increase writing speed by the desired amount. By using a lesser amount of high secondary emissive material, the resulting storage dielectric produces a higher brightness light image, due in part to the greater percentage of phosphor material, and in part to lower attenuation of such light image by the secondary emissive material. In addition, by disposing secondary emissive material on only a portion of the surface of each phosphor particle, low velocity flood electrons are able to strike both the phosphor particle and its secondary emissive coating simultaneously. This makes more efficient use of the phosphor material since the secondary emissive material does not prevent electrons from striking the phosphor. In this regard, it should be noted that the low velocity flood electrons are accelerated through a potential difference of only about 200 to 500 volts, so tha they will not pass through a layer of secondary emissive material on a phosphor particle if the particle is completely masked by the material. This in fact occurs in prior storage dielectric employing a mixture of phosphor material and secondary emissive material.

The method of storage dielectric manufacture of the present invention forms a high secondary emissive material from a substance coated on the phosphor particles, so that the material becomes intimately bonded to the phosphor particles as it is formed. By contrast, in previous storage dielectrics the secondary emissive material is formed separately before it is mixed with the phosphor particles, and is not bonded to the phosphor particles.

The phosphor storage dielectric can be made sufficiently porous to enable collection of secondary electrons through the dielectric, and the addition of secondary emissive material produced by the method of the invention does not interfere with such collection because it is bonded to the phosphor particles and does not fill the pores between adjacent phosphor particles, unlike previous storage dielectrics in which the material is merely mixed with the phosphor. In addition, it has been found that the storage dielectric of the present invention has a longer useful lifetime than previous phosphor storage dielectrics.

Accordingly, one object of the present invention to provide improved bistable storage apparatus which is capable of fast writing speed in producing a stored charge image and which emits a light image of high brightness corresponding to the stored charge image.

Another object of the present invention is to provide an improved storage tube of simple and economical construction which employs a storage dielectric comprised of phosphor particles and high secondary emissive material coated on such phosphor particles.

Still another object of the present invention is to provide an improved storage dielectric of long, useful lifetime which is capable of bistable storage of a charge image produced thereon at a fast writing speed, and which emits a light image of high brightness corresponding to the stored charge image by employing phosphor particles coated with high secondary emissive material bonded to the particles.

A further object of the present invention is to provide an improved method of manufacture of a phosphor storage dielectric capable of bistable charge image storage by which a high secondary emissive material is formed from a substance previously coated on the phosphor particles so that the secondary emissive material formed is simultaneously bonded to the phosphor particles.

An additional object of the present invention is to provide an improved storage dielectric of phosphor particles coated by smaller particles of high secondary emissive material bonded to the phosphor particles to enable efficient use of a small amount of secondary emissive material to increase the writing speed of the storage dielectric without greatly decreasing the brightness of the light image emitted by the phosphor particles and, at the same time, to provide a longer useful lifetime for the storage dielectric.

BRIEF DESCRIPTION OF THE DRAWINGS

Additional objects and advantages of the present invention will be apparent from the following detailed description of certain preferred embodiments thereof and from the attached drawings of which:

FIG. 1 is a schematic diagram of charge image storage apparatus including a simplified storage tube employing the storage dielectric of the present invention;

FIG. 2 is an enlarged horizontal section view taken along the line 2—2 of FIG. 1 showing a portion of one embodiment of a storage target employing the storage dielectric of the present invention;

FIG. 3 is an enlarged section view of a portion of another embodiment of a storage target employing the storage dielectric of the present invention;

FIG. 4 is an enlarged section view of a portion of a third embodiment of a storage target employing the storage dielectric of the present invention; and FIG. 5 is a greatly enlarged section view of a portion of the storage dielectric of the present invention which may be employed in either of the storage targets of FIGS. 2, 3 or 4.

DESCRIPTION OF PREFERRED EMBODIMENTS

As shown in FIG. 1, a charge image storage apparatus in accordance with the present invention includes a simplified direct viewing bistable storage tube 10 of the type shown in U.S. Pat. No. 3,293,473 of R. H. Anderson, issued Dec. 20, 1966. A phosphor storage target 12 is mounted within the evacuated envelope of the storage tube, positioned so as to be bombarded by high velocity writing electrons emitted from a writing gun cathode 14, which may be connected to a D.C. potential of −3,000 volts. The writing gun also includes a control grid 16 as well as accelerating and focusing anodes 18 for forming a narrow beam of high velocity writing electrons. The beam of writing electrons is transmitted through horizontal deflection plates 20 and vertical deflection plates 22 which deflect the beam in a conventional manner to cause it to produce a charge image on the phosphor storage dielectric of storage target 12.

The writing gun also may be employed as a reading gun for scanning the storage dielectric to produce an electrical readout signal on the target electrode of storage target 12 corresponding to the stored charge image. This is accomplished by moving switches 24, 26 and 28 from the "write" position to the "read" position. In the write position, switch 24 connects control grid 16 to a D.C. supply voltage of −3,025 volts, and in the read position to a supply voltage of −3,050 volts, which slightly reduces the current density of the reading beam and prevents erasure of the stored charge image during readout. In the write position of switch 26, horizontal deflection plates 20 are connected to a horizontal sweep generator 30 which applies a sawtooth, or ramp, voltage thereto, while in the write position of switch 28 vertical deflection plates 22 are connected to the output of a vertical amplifier 32 whose input terminal 34 is connected to the source of the input signal whose waveform is sought to be stored on target 12. Vertical amplifier 32 and horizontal sweep generator 30, as well as storage tube 10, all form parts of a cathode-ray oscilloscope which operates in a conventional manner and will not be described further.

Once a charge image is written on storage target 12 by high velocity writing electrons, it can be stored as a bistable charge image in a conventional manner by bombarding the storage dielectric uniformly with low velocity flood electrons emitted from flood guns 36. During storage, a voltage of approximately +200 with respect to the flood gun cathode is applied to the backing plate or target electrode of storage target 12 by a voltage divider including a fixed resistor 37 connected in series with a variable resistor 38 by a switch 40. Such a target voltage is within the "stable range" of voltages over which the storage dielectric is capable of bistable storage of a charge image formed thereon.

In order to erase the charge image, switch 40 is moved from the "store" position to the "erase" position, which connects a variable resistor 42 in series with resistor 37 to apply a voltage above the "fade positive" voltage to the target electrode. This causes the potential of the storage dielectric to increase until it is substantially uniform and equal to the potential of the target electrode. Next, the target voltage is decreased below the "retention threshold" voltage and then raised slowly above the retention threshold voltage into the stable range to enable bistable storage of another charge image. While this variation in target voltage for erasure may be done manually using variable resistor 42, in actual practice it is done by pulsing the target electrode. In order to assure uniform bombardment of the storage dielectric of target 12 by low velocity flood electrons, a plurality of collimating electrodes may be provided as coatings on the inner wall of the storage tube envelope, one such collimating electrode 44 being shown in FIG. 1, connected to a D.C. supply voltage of +50 volts, intermediate the voltages of the flood gun cathode and the target electrode.

In order to provide an electrical readout signal, a raster signal generator 46 is connected to the horizontal and vertical deflection plates of the storage tube through switches 26 and 28, respectively, in their read position. The raster signals may be sawtooth voltages similar to those employed in a conventional television receiver, wherein the vertical signal has a frequency of 60 cycles per second and the horizontal signal has a frequency of about 15,000 cycles per second. This causes the electron beam emitted by cathode 14 to be scanned uniformly across the surface of the storage target in a rectangular raster pattern to produce an electrical readout signal on the target electrode. The readout signal is transmitted through an A.C. coupling capacitor 48, a preamplifier 50 and a power amplifier 52 to the Z-axis, or brightness, modulation input of a television monitor tube 54. The horizontal and vertical deflection plates of monitor tube 54 may be driven by raster signal generator 46 at the same frequency or at a frequency related to that of the corresponding raster signals supplied to the storage tube, in order to reproduce the stored charge image on the television monitor tube through brightness modulation of its electron beam by the electrical readout signal of the storage tube.

As shown in FIG. 2, one embodiment of the storage tube of the present invention includes a storage target 12 having a storage dielectric 55 of phosphor material and high secondary emissive material. The storage dielectric is applied as an integral or undivided layer of particles over a thin, light transparent conductive film 56 of tin oxide forming the storage target electrode. Film 56 is coated on the inner surface of a glass faceplate 57 forming part of the storage tube envelope. The target electrode film extends through a seal provided between faceplate 57 and a funnel portion 58 of the envelope to enable electrical connection to an external voltage source. When funnel portion 58 of the envelope is made of ceramic material, it is sealed to faceplate 57 by a fused glass frit 60, which apparently penetrates the thin, conductive film 56. While not essential, graticule lines 62 in the form of scribed notches or fused glass frit deposits may be provided on the inner surface of faceplate 57 beneath conductive film 56, such graticule lines being illuminated by edge lighting the faceplate with light bulbs (not shown) outside the envelope.

Storage dielectric layer 55 is sufficiently thin and porous to enable secondary electrons emitted from the surface of the layer upon bombardment by the writing beam and the flood electrons to pass through the layer by way of the pores between adjacent phosphor particles, and be collected by target electrode 56. The operation of such a storage target is described in greater detail in U.S. Pat. No. 3,293,473 mentioned previously. However, the storage dielectric employed in storage target 12, a portion of which is shown in FIG. 5, differs from that of the above-mentioned patent in that phosphor particles 64 are coated on at least a portion of their outer surface with smaller particles 66 of high secondary electron emissive material bonded to the phosphor particles and substantially uniformly distributed throughout the storage dielectric layer.

While different storage phosphors and secondary emissive materials may be employed, in a preferred embodiment of the present invention P-1 phosphor, i.e., manganese activated zinc orthosilicate, chemically written as $Zn_2SiO_4:Mn$, has been used for phosphor particles 64, with magnesium oxide (MgO) used for secondary emissive particles 66. While the exact nature of the bond between the secondary emissive particles and the phosphor particles is not clearly understood, it is thought that the magnesium of the secondary emissive material reacts with the oxygen of the P-1 phosphor to produce a chemical bond. However, it is also possible that the secondary emissive particles are surface bonded to the phosphor particles by sintering or other non-chemical bonding. In any event it is clear that secondary emissive particles 66 are tightly bonded in intimate contact with phosphor particles 64 and are coated on the outer surface of the phosphor particles, as opposed to being loosely mixed with such phosphor particles in the manner of prior phosphor storage dielectrics. As a result, fewer secondary emissive particles 66 are used in the present storage dielectric, but an even faster writing rate is produced without greatly decreasing the brightness of the light image emitted by the phosphor particles, since there is a greater percentage of phosphor and the secondary emissive particles do not prevent flood electrons from striking the phosphor particles. In addition, since the particles of secondary emissive material are bonded to the phosphor particles, they do not pack in the pores or spaces between adjacent phosphor particles. Such packing tends to interfere with efficient collection of secondary electrons through the storage dielectric by the target electrode 56, as is thought to be the case in earlier storage dielectrics.

The storage dielectric shown in FIG. 5 can be employed in other storage target structures, including the two additional embodiments shown in FIGS. 3 and 4. The storage target 12° of FIG. 3 is similar to that of FIG. 2 except that a storage dielectric layer 68 of much greater thickness is made possible by providing a plurality of spaced apertures, or holes, 70 through the dielectric to enable the collection of secondary electrons by target electrode 56 through such holes. Thus, while integral storage dielectric layer 55 of FIG. 2 must be sufficiently thin to enable transmission of secondary electrons through the pores between the phosphor particles, this is not necessary with the target of FIG. 3 because artificial pores, i.e., holes 70 have been provided. Holes 70 provide substantially straight passageways through the storage dielectric 68 so that even if such storage dielectric is too thick to enable secondary electrons to pass through the pores between adjacent phosphor particles, such secondary electrons can be collected by target electrode 56 through holes 70. As in the case of FIG. 2, the storage dielectric 68 of the target 12' of FIG. 3 is in the form of phosphor particles with particles of secondary emissive material bonded thereto, as shown in FIG. 5.

FIG. 4 shows a third embodiment of the invention, a storage target 12" similar to that of target 12 in FIG. 2 except that the storage dielectric is divided into a plurality of separate spaced portions, or dots, 72 and target electrode film 56 is provided with a plurality of apertures distributed uniformly over the surface of the storage target with dots 72 disposed within the apertures in contact with glass faceplate 57. The dots are made of the same storage dielectric comprising phospher particles 64 coated by smaller particles 66 of secondary emissive material, in the manner shown in FIG. 5. A storage tube employing this type of dot pattern storage dielectric is described in U.S. Pat. No. 3,293,474 of C. B. Gibson, issued Dec. 20, 1966.

In addition to P-1 phosphor, particles 64 of the storage dielectric can be made of other storage phosphors, including P-3 phosphor (zinc beryllium silicate with a manganese activator, written as $ZnBeSiO_4:Mn$), and P-5 phosphor (calcium tungstate with a tungstate activator, written as $CaWO_4:W$), The storage phosphor also may be P13 phosphor, which is magnesium silicate with a manganese activator, P-16, which is calcium magnesium silicate with an activator of cesium and lithium, P-25, which is calcium silicate with a manganese activator, or P-27, which is zinc phosphate with a manganese activator.

Furthermore, secondary electron emissive materials other than magnesium oxide may be employed, such as aluminum oxide ($Al_2O_3$), beryllium oxide (BeO) or combinations of these materials. Of course, the secondary emissive material must have a higher secondary electron emission efficiency than the phosphor with which it is employed. It should also be noted that both the phosphor and secondary emissive material must be of high resistivity in order to enable bistable storage.

When a storage target made in accordance with FIG. 2 was provided with a storage dielectric comprised of P-1 phosphor particles coated with 35% magnesium oxide secondary emissive, a writing speed of approximately 400,000 centimeters per second was obtained at a flood gun current of 60 microamperes, and the light image produced had a brightness of approximately 3.5 foot-lamberts.

The storage dielectric of FIG. 5 may be made by a method of manufacture which includes the steps of coating phosphor particles with a secondary emissive-forming substance heating the coated phosphor particles to form the secondary emissive material and simultaneously to bond the secondary emissive material to the surface of the phosphor particles. As a specific example, 96.5 grams of P-1 phosphor is added to a solution formed by 18.6 grams of magnesium acetate tetrahydrate dissolved in 400 milliliters of distilled water. The thus formed phosphor slurry is heated to remove all of the water while stirring to prevent the phosphor particles from precipitating out of the slurry. A dry particulate material is obtained which includes particles of P-1 phosphor material coated by magnesium acetate. This coated particulate material is then fired at a temperature of 700° centigrade in air for about 1 hour to cause the formation of small particles of magnesium oxide secondary emissive material and simultaneously to bond such secondary emissive material to the surface of the P-1 phosphor particles. This provides a storage dielectric in which substantially all of the secondary emissive material is bonded to the phosphor particles and is distributed substantially uniformly over the surface thereof as shown in FIG. 5. The resulting storage dielectric has a chemical composition of 96.5 percent P-1 phosphor and 3.5 percent magnesium oxide. The above method can be carried out with any suitable magnesium salt which is soluble in water, such as magnesium nitrate.

It should be noted that an "active" magnesium oxide having a high secondary emission efficiency is apparently formed only at temperatures below 900° centigrade. However, higher temperatures may be employed with the other secondary emissive materials. In this regard, when aluminum oxide is employed as the secondary emissive, aluminum acetate or other water soluble aluminum salt, such as aluminum nitrate, may be employed as the material coated on the phosphor particles to form the secondary emissive material. Similarly, when beryllium oxide is the secondary emissive material to be formed, a water soluble beryllium salt such as beryllium carbonate may be employed.

After the storage dielectric of phosphor particles coated with secondary emissive material is formed, it may be applied to the faceplate of the storage tube in an conventional manner, such as by water settling, spraying, photographic masking in the case of FIG. 4, or by employing a decalcomania of a temporary binder of plastic or other organic material mixed with the storage dielectric. The decal is formed as a thin, self-supporting sheet of substantially uniform thickness. The organic binder material is removed by the heating and outgassing process during the evacuation step of storage tube manufacture.

Another method of forming the phosphor storage dielectric of the present invention similar to that described above involves forming a slurry of P-1 phosphor and magnesium nitrate dissolved in water as in the previously described method. To this slurry is added an amount of ammonium carbonate sufficient to cause magnesium carbonate ($MgCO_3$) to precipitate onto the surface of the P-1 phosphor particles. The solution is then filtered to remove the coated phosphor particles and the particles are dried to provide a particulate material of P-1 phosphor particles coated with magnesium carbonate. The coated phosphor particles are then fired in air at 700° centigrade for 1 hour to cause the formation of magnesium oxide and to bond such magnesium oxide to the surface of the P-1 phosphor particles. Alternatively ammonium hydroxide can be substituted for the ammonium carbonate in the above method, so that magnesium hydroxide precipitates onto the phosphor particles and forms the secondary emissive coating of MgO.

The storage of manufacture of the present invention insure a uniform concentration of the secondary emissive material throughout the storage dielectric and are capable of reproducing storage dielectrics of similar writing rate and brightness characteristics on the storage tube faceplates. As a result, the percentage of tubes which meet performance characteristic specifications greatly increases, and there are fewer defective storage tubes which must be discarded.

It will obvious to those having ordinary skill in the art that many changes may be made in the above-described preferred embodiments of the present invention. For example, other types of storage targets in storage tubes may be made which employ the storage dielectric of the present invention in different target structures. Also it is possible that the coating of secondary emissive forming material may be formed on the phosphor particles by vapor deposition rather than by liquid evaporation. Therefore the scope of the present invention should only be determined by the following claims.

I claim:

1. A method of manufacture of a charge image storage dielectric capable of bistable storage of a charge image formed thereon, comprising the steps of:
    coating a plurality of particles of phosphor material with a secondary emissive-forming substance; and
    heating the coated phosphor particles to form a secondary electron emissive material from said substance and to bond said secondary emissive material to the outer surface of said phosphor particles whereby a storage dielectric is formed with said secondary emissive material being substantially uniformly distributed throughout said storage dielectric.

2. A method in accordance with claim 1 in which the coating step includes dissolving the secondary emissive-forming substance in water, mixing the phosphor particles with the resulting solution to provide a slurry, and drying the slurry to remove the water and leave a coating of said substance on said phosphor particles.

3. A method in accordance with claim 1 in which the coating step includes dissolving a first substance in water, mixing the phosphor particles with the resulting solution to form a slurry, mixing a second substance with the slurry which reacts with said first substance to produce the secondary emissive-forming substance, and causes said secondary emissive-forming substance to precipitate onto the phosphor particles to form a coating, and filtering the slurry to remove the coated phosphor particles.

4. A method in accordance with claim 1 in which the phosphor material is manganese activated zinc orthosilicate and the secondary electron emissive material is magnesium oxide formed by coating the phosphor particles with a magnesium compound and heating the coated particles in a oxygen-containing atmosphere.

5. A method in accordance with claim 4 in which the heating temperature is less than about 900° C.

6. A method in accordance with claim 1 in which the storage dielectric is applied to a support member after the phosphor particles are coated with secondary emissive material to produce a storage target capable of bistable storage of a charge image.

7. A method in accordance with claim 6, wherein said storage dielectric is applied as a continuous layer.

8. A method in accordance with claim 6, wherein said storage dielectric is applied as a patterned layer.

* * * * *